United States Patent
Guiver et al.

(10) Patent No.: US 9,558,452 B2
(45) Date of Patent: Jan. 31, 2017

(54) HIERARCHICAL STATISTICAL MODEL FOR BEHAVIOR PREDICTION AND CLASSIFICATION

(71) Applicant: Microsoft Corporation, Redmond, WA (US)

(72) Inventors: John Guiver, Cambridge (GB); John Winn, Cambridge (GB); James Edelen, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 652 days.

(21) Appl. No.: 14/076,106

(22) Filed: Nov. 8, 2013

(65) Prior Publication Data

US 2015/0134304 A1      May 14, 2015

(51) Int. Cl.
| | |
|---|---|
| *G06F 17/50* | (2006.01) |
| *G06N 7/00* | (2006.01) |
| *G06Q 10/00* | (2012.01) |
| *G06Q 10/10* | (2012.01) |

(52) U.S. Cl.
CPC ............... *G06N 7/00* (2013.01); *G06Q 10/00* (2013.01); *G06Q 10/107* (2013.01); *G06F 17/5009* (2013.01)

(58) Field of Classification Search
USPC ...................... 703/2, 22; 706/12, 20; 463/36
See application file for complete search history.

(56) References Cited

U.S. PATENT DOCUMENTS

| | | | |
|---|---|---|---|
| 5,845,048 A | * | 12/1998 | Masumoto ............. B25J 9/1697 706/20 |
| 6,901,398 B1 | | 5/2005 | Horvitz et al. |
| 2006/0085248 A1 | | 4/2006 | Arnett et al. |

(Continued)

OTHER PUBLICATIONS

Ayodele, et al., "Machine Learning Email Prediction System (MLEPS)", In International Journal for Infonomics, vol. 3, Issue 4, Dec. 2010, 5 pages.

(Continued)

*Primary Examiner* — Thai Phan
(74) *Attorney, Agent, or Firm* — Anand Gupta; Tom Wong; Micky Minhas

(57) ABSTRACT

Technologies are generally provided far a hierarchical, feature teed statistical model that cm be used for personalized classification or predictions within a community of users. Personalization refers to learning about the habits and characteristics of individual users and adapting user experiences based on that learning. The model may be used in a communication application to predict user actions on incoming email messages and to help users triage email by making personalized suggestions based on the model predictions. A community of users associated together with the communication application may be incorporated together into a single model to enable for continuous fine-grain interaction between intelligence learned from the community of users as a whole and that learned from individual users. The single model may allow a seamless progression between predictions for a completely new user based on community observations and highly personalized predictions for a long-term user based on individual observations.

20 Claims, 8 Drawing Sheets

(56) References Cited

U.S. PATENT DOCUMENTS

| | | | |
|---|---|---|---|
| 2006/0247915 A1 | 11/2006 | Bradford et al. | |
| 2008/0146334 A1* | 6/2008 | Kil | G06F 19/345 463/36 |
| 2012/0143806 A1 | 6/2012 | Sundelin et al. | |
| 2012/0269436 A1 | 10/2012 | Mensink et al. | |
| 2012/0290662 A1 | 11/2012 | Weber et al. | |
| 2013/0080362 A1 | 3/2013 | Chang et al. | |
| 2013/0144818 A1* | 6/2013 | Jebara | G06N 99/005 706/12 |
| 2013/0159220 A1 | 6/2013 | Winn et al. | |
| 2015/0324699 A1* | 11/2015 | Jebara | G06N 99/005 706/12 |

OTHER PUBLICATIONS

Dredze, et al., "Intelligent Email: Reply and Attachment Prediction", In Proceedings of the 13th International Conference on Intelligent User Interfaces, Jan. 13, 2008, 4 pages.

Cubranic, et al., "Automatic Bug Triage Using Text Categorization", In Proceedings of the Sixteenth International Conference on Software Engineering & Knowledge Engineering, Jun. 20, 2004, 6 pages.

"International Search Report and Written Opinion Issued in PCT Patent Application No. PCT/US2014/063770", Mailed Date: Apr. 29, 2015, 10 Pages.

\* cited by examiner

HIERARCHICAL STATISTICAL MODEL FOR BEHAVIOR PREDICTION AND CLASSIFICATION

BACKGROUND

In a collaborative environment users may receive vast amounts of data from a number of data sources such as content generators, databases, search engines, other users, and so on. For example, users may receive phone calls, email messages, calendar requests, text messages, and other types of data and alerts. Manually reading, responding, and organizing these vast amounts of class can be overwhelming, time-consuming, and inefficient for the individual users.

Some applications attempt to simplify user actions in response to the data by anticipating the actions the user may take upon receipt of the incoming data. Such applications may attempt to understand the behaviors of the user by classifying the user's behavior based on observed user response trends. However, many attempts have limitations, as the observed trends may be too simplistic, generic, broad, or vague to accurately predict how the user may respond to the incoming data.

SUMMARY

This summary is provided to introduce a selection of concepts in a simplified form that are further described below m the Detailed Description. This summary is not intended to exclusively identify key features or essential features of the claimed subject matter, nor is it intended as an aid in determining the scope of the claimed subject matter.

Embodiments are directed to a hierarchical, feature based statistical model that may be used for personalized classification or predictions within a community of users. The model may be used to learn about the habits and characteristics of individual users and adapt user experiences based on that learning. A community of users associated together with the communication application may be incorporated together into a single model to enable for continuous fine-grain, interaction between intelligence learned from the community of users as a whole and that learned from individual users. The single model may allow a seamless progression between predictions for a completely new user based on community observations and highly personalized predictions for a long-term user based on individual observations.

These and other features and advantages will be apparent from a reading of the following detailed description and a review of the associated drawings. It is to be understood that both the foregoing general description and the following detailed description are explanatory and do not restrict aspects as claimed.

DETAILED DESCRIPTION

Figure 1:
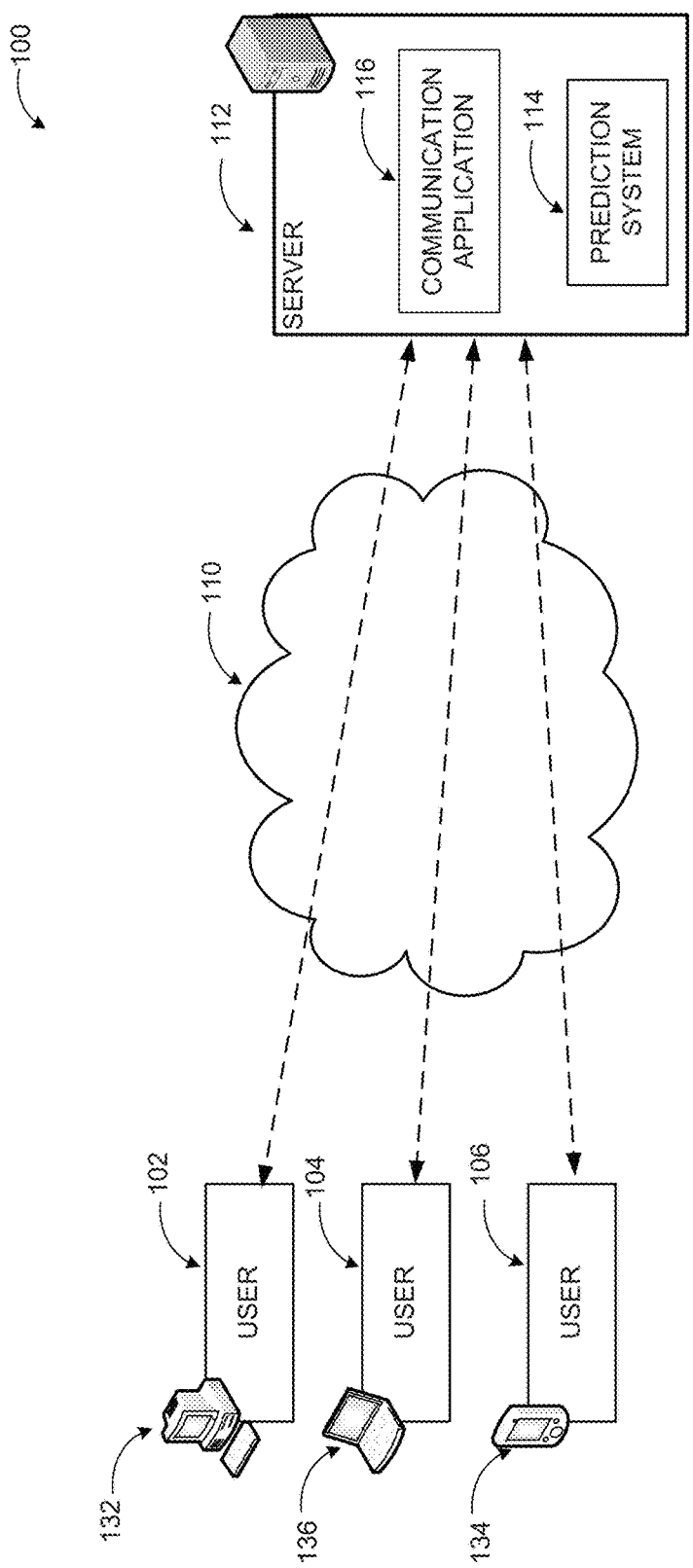
FIG. 1 illustrates an example cloud-based environment for observing and predicting user actions.

As briefly described above, a system is provided to facilitate personalized classification or predictions within a community of users. The system may include a hierarchical, feature based statistical model that can be used to learn about the behaviors and habits of individual users and to adapt user experiences based on that learning. The model may be used in a communication application to predict user actions on incoming email messages and to help users triage email by making personalized suggestions based on the model predictions. A community of users associated together with the communication application may be incorporated together into a single model to enable for continuous fine-grain interaction between intelligence learned from the community of users as a whole and that learned from individual users. The single model may allow a seamless progression between predictions for a completely new user based on community observations and highly personalized predictions for a long-term user based on individual observations.

In the following detailed description, references are made to the accompanying drawings that form a part hereof, and in which are shown by way of illustrations specific embodiments or examples. These aspects may be combined other aspects may be utilized, and structural changes may be made without departing from the spirit or scope of the present disclosure. The following detailed description is therefore not to be taken in the limiting sense, and the scope of the present invention is defined by the appended claims and their equivalents.

While the embodiments will be described in the general context of program modules that execute in conjunction with an application program that runs on an operating system on a personal computer, those skilled in the art will recognize that aspects may also be implemented in combination with other program modules.

Generally, program modules include routines, programs, components, data structures, and other types of structures that perform particular tasks or implement particular abstract data types. Moreover, those skilled in the art will appreciate that embodiments may be practiced with other computer system configurations, including hand-held devices, multi-processor systems, microprocessor-based or programmable consumer electronics, minicomputers, mainframe computers, and comparable computing devices. Embodiments may also be practiced in distributed computing environments where tasks are performed by remote processing devices that are linked through a communications network. In a distributed computing environment, program modules may be located in both local and remote memory storage devices.

Embodiments may be implemented as a computer-implemented process (method), a computing system, or as an article of manufacture, such as a computer program product or computer readable media. The computer program product may be a computer storage medium readable by a computer system and encoding a computer program that comprises instructions for causing a computer or computing system to perform example process(es). The computer-readable storage medium is a computer-readable memory device. The computer-readable storage medium can for example be implemented via one or more of a volatile computer memory, a non-volatile memory, a hard drive, a flash drive, a floppy disk, or a compact disk, and comparable media.

Throughout this specification, the term "platform" may be a combination of software and hardware components for providing a hierarchical, feature based statistical model for behavior predication and classification. Examples of platforms include, but are not limited to, a hosted service executed over a plurality of servers, an application executed on a single computing device, and comparable systems. The term "server" generally refers to a computing device executing one or more software programs typically in a networked environment. However, a server may also be implemented as a virtual server (software programs) executed on one or more computing devices viewed as a server on the network. More detail on these technologies and example operations is provided below.

According to some embodiments a hierarchical, feature based statistical model may be provided for behavior prediction and classification in a communication system. According to other embodiments, a similar behavior prediction and classification may be provided for one or more of an advertising system, a content generation/distribution system in a content or product marketplace, a search system, a navigation system, a services system, and comparable systems.

For example, in an advertising system (such as video, print, search, etc.) community and personalized parameters may be determined for predicting the advertisements that may bring highest revenue or attract most attention. In a content marketplace (such as news articles, TV shows, books, music, and the like) or product marketplace (electronics, groceries, etc.) community and personalized parameters may be determined for predicting the goods or content an individual is interested in purchasing. In a search system (e.g., universal or localized search engines) community and personalized parameters may be determined for predicting the results an individual is most likely to select. In a navigation system (airline booking, car GPS, etc.) community and personalized parameters may be determined tor predicting a best route of travel for the individual's preferences. Furthermore, in a services system (e.g., medicine, financial planning, maintenance, etc.) community and personalized parameters may be determined for predicting the optimal use of services (such as what medical procedure to undertake, which instruments to buy/sell, how frequently to have maintenance performed, etc.) based on lifestyle preferences, risk tolerances, and similar aspects of individuals compared to that of the general population. Effectively embodiments may be employed in any system that has access to a large pool of individuals' preferences to learn community and personalized parameters associated with items or events targeted at an individual in that system.

FIG. 1 illustrates an example cloud-based environment for observing and predicting user actions, according to embodiments.

As demonstrated in diagram 100, users (102, 104, and 106) may access an application providing a multitude of communication capabilities, such as a communication application 116, over a cloud-based network 110. The communication application 116 may be hosted at a remote server 112 and accessed through a user's client device over the cloud-based network 110. The communication application 116 may also be locally boated at the user's client device, and data associated with the communication application may be retrieved from the remote server 112 over the cloud-based network 110. The communication application 116 may be an application providing a multitude of communication capabilities such as email, text messaging, VOIP, conferencing, instant messaging, phone cabs, contacts, management, calendar management, and other similar capabilities. Different types of data associated, with the communication application 116 such as email messages, text messages, instant messages, voicemail messages, phone calls, multimedia and/or audiovisual messages, documents, RSS feeds, social network updates, and other similar alerts and data may be received and interacted with at the user's client device. Example client devices may include a laptop computer 136, a desktop computer 132, a smart phone 134, a earphone, a mobile phone, a tablet, and/or a home automation device.

In an example embodiment, upon receipt of incoming data over the cloud-based network 110 at the user's individual computing device, a user 102 may respond to the incoming data by executing a particular action. For example, in response to receipt of an email message, the user 102 may read and respond to the email, ignore the email, prioritize the email, delete the email, flag the email, move the email to a particular categorized folder, and/or save the email, for later, as some example actions. As another example, if the user 102 receives a calendar alert and/or an event request, the user may add the event to the user's personal calendar, and also may categorize the event as a work or personal event, and may mark the event as important. As yet another example, when the user receives a text message, some available response actions the user may take may include reading, responding, deleting, or saving the message for later. The above example response actions represent some available actions the user may take in response to incoming data, however, it is recognized that there are multiple other actions that may be available for a user to take in response to receipt of varying incoming data. Similarly, another user 104 associated with the communication application 116 over the cloud-based network 110 may receive personal data at the user's client device and may execute other actions in response to the received data.

In a system according to embodiments, a prediction system 114 associated with the communication application 116 may facilitate personalized classification and prediction of user actions. Personalization may refer to learning about habits and characteristics of a user, and adapting a user's experience based on that learning. The prediction system 114 may observe multiple user interactions with data, and may predict suture user actions in response to the incoming data baaed on the observed user interactions. The prediction system 114 may build a prediction model based on observed user interactions with data in order to predict actions a user is likely to take in response to receipt of new data.

In a system according to embodiments, the prediction, system 114 may be configured to monitor individual users, such that the prediction system 114 may make predictions of user action that are personalized to the specific observed user. The prediction system 114 may also be configured to observe a group of multiple users concurrently. The prediction system 114 may incorporate the observed actions of the group of users into a single prediction model, which may allow for continuous fine-grain interaction between intelligence learned from the individual users and from the group as a whole. Incorporating observed actions of individual users and the group of users into the prediction model may enable a seamless progression between predictions for a completely new user and highly personalized predictions of a long-term user. For example, a new user's response action may be predicted based on group data of the multiple users (102, 104, and 106) observed and organized by the prediction system 114, when no historical information about that specific user is available.

Predictions may be presented to a user in a user-friendly way such that the user can understand easily what action has been taken based on a prediction or what action is about to be taken. For example, if the prediction is that the user may ignore an item, the user interface may present the stent in gray rather than black, or if the prediction is that the user may delete the item, a "Delete" button may be presented next to the item (as opposed to an item that is deemed important, where the "Delete" button may not necessarily be presented immediately). In an example embodiment, based on the predicted actions, the prediction system 114 may be configured to provide a suggested action to the user 102 in real time, and await user approval of the predicted action. In another embodiment, the prediction system 114 may automatically perform the predicted action on behalf of the user 102. For example, the system may automatically save an email attachment to a labeled folder or mark an incoming message as high priority for response. The prediction system 114 may further be configured to continuously observe the user actions in response to incoming data in order to continuously and dynamically update the determined probabilities and refine user action predictions in order to increase the accuracy of the predicted actions.

As described herein, an example prediction system 114 may be so email prediction system where the system may predict user actions such as reply, read, delete, and ignore to help users triage email by snaking personalized suggestions or indications based on model predictions. When a message is received, the message is convened to a set of feature values, where a feature is an input to the prediction model derived from identified properties of the message. Example features may be, whether the sender is a manager, a number of attachments, a sender domain, and other content based features. Each feature may be associated with several buckets, where each bucket represents different discrete values that a feature can take.

As used herein, a Feature may be a self-contained calculation, that produces zero or more pairs of the form (Feature Bucket, Feature Bucket Value), where the value is numeric. Each such pair may be called a Bucket item. The feature calculation may depend on raw data associated with a received message, or other received data, and may also depend on calculations of other related features. The Feature Buckets may represent a set of discrete choices for actions to be taken. The Feature Buckets may also represent a discretization of a continuous property. Each Feature may have a Feature Identity, Each Feature Bucket may have a Local Bucket Identity, which may be unique with respect to a Feature. The combination of a Feature identify and a particular Local Feature Bucket identity may provide a Global Identity, which can be used as a key for Bucket values. Bucket. Identities for a Feature may be known in advance, and additional Bucket identities may arise in operation. In cases where a feature calculation produces one or more Bucket items, the Bucket values for those features may be normalized to sum to 1.0 in order to allow different features to participate equally in the calculation. A Feature Set may be a set of Features used to define the calculation of the feature data input into the prediction model.

As also used herein, Communal Features may be features for which individual Buckets are generally applicable to multiple different users (i.e. a community of users). For example, a feature such as "Sender is a manager," which has "Sender is immediate manager," and "Sender is higher-level manager," as Buckets, may be a Communal Feature because it may be applicable to other users. A Non-Communal Feature may be a personal feature associated with a particular user. For example, a Sender feature, where the associated Buckets are the identities of the Senders, may be associated with a particular user, since two mailboxes taken at random may be unlikely to nave senders in common, and users may have different response patterns to a given sender. A user-dependent map may specify the identity of corresponding community parameters for each user and each personal bucket identity.

In a prediction model, as will, be described in further detail below, a Bucket Identity that becomes active for a given user may have an associated parameter or weight. If a weight has not yet been established for a given Bucket Identity, the weight may be derived from a community distribution associated with the Bucket Identity. The community distribution may be parameterized by community parameters, including a mean parameter and a precision parameter. Community distributions may be learned for all Feature Identities and Bucket identities of communal features. If community parameters have not yet been established for a given Bucket Identity, the parameters may be derived from the given Bucket's Feature-level parameters. Personal parameters may be weights representing a contribution of each Feature Bucket to observed actions. In an example prediction model, the personal and community parameters may maintain a measure of uncertainty.

Figure 2:
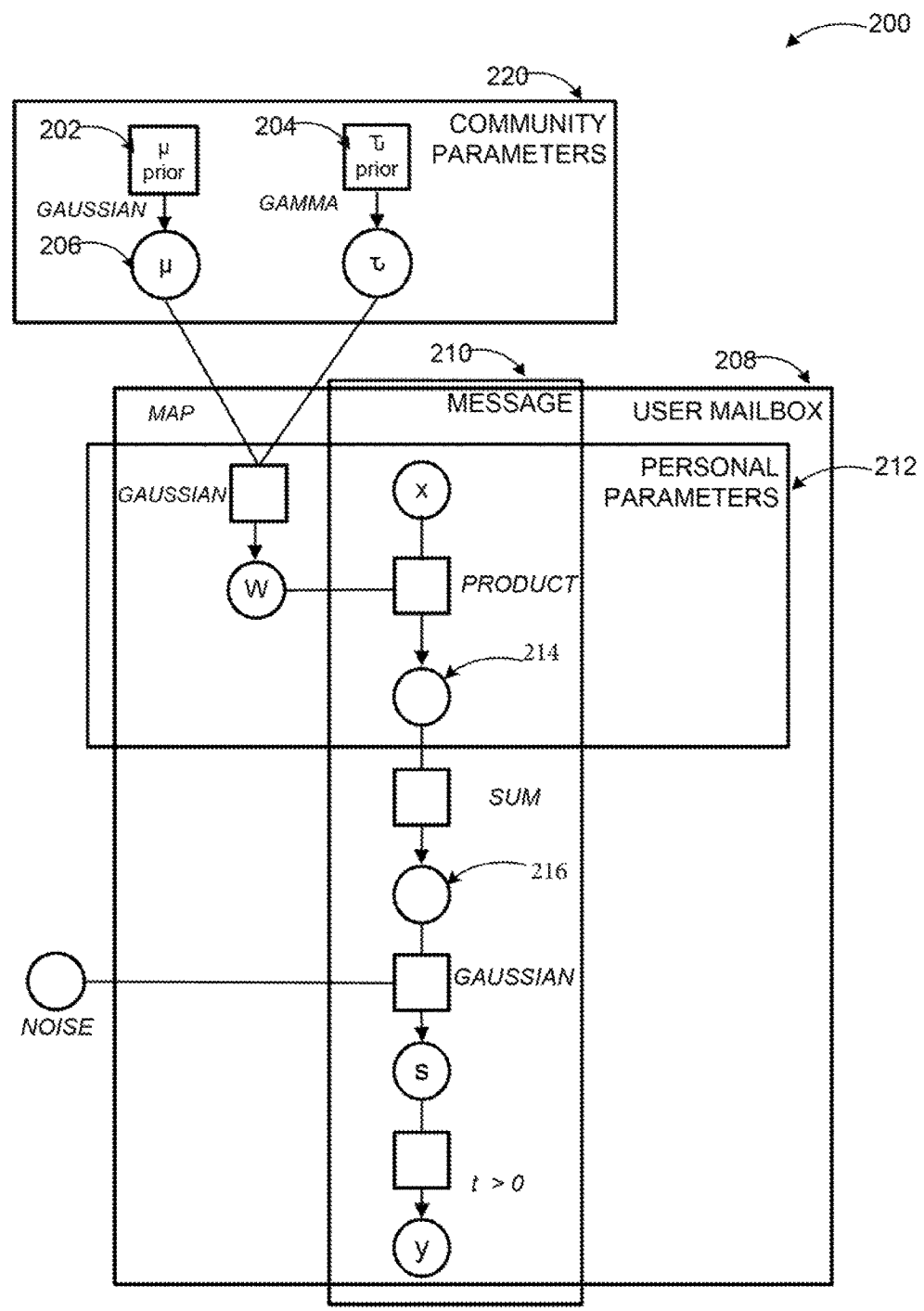
FIG. 2 illustrates an example factor graph of a hierarchical regression model for personalized predictions of user behavior within a community of users.

FIG. 2 illustrates an example factor graph of a hierarchical regression model for personalized predictions of user behavior within a community of users, according to some example embodiments.

In a system according to embodiments, an example prediction model for predicting user behavior within a community of users may be a hierarchical regression model. Diagram 200 illustrates a factor graph of the prediction model that represents a joint probability density function in terms of its factors. In the factor graph, small squares (202, 204) are factors (functions, constraints, or distributions), and circles 206 represent random variables. Each factor may be connected to the variables that participate as input or output in the function's calculation. The arrows coming out of factors show output variables (214, 216) of the factor, i.e., such variables are defined by the factor as dependencies on the input variables. The factors in the factor graph may be multiplied together to give a joint probability distribution. In some examples, the probability distribution for the factor graph of diagram 200 may be written as follows:

$$\prod_u \left( \prod_n \left( \mathbb{1}(y_{un} = s_{un} > 0) \mathcal{N}\left(s_{un} \middle| \sum_i w_{ui} x_{uni}, v\right) \right) \right.$$
$$\left. \prod_i \mathcal{N}(w_{ui} \mid \mu_{c[i]}, \tau_{c[i]}) \right) \prod_c \mathcal{N}(\mu_c) \mathcal{G}(\tau_c)$$

where:
u: Index of user
n: Index of message for a given user
i: Index of feature bucket for a given user c[i]: User dependent index of community feature or bucket seeding the given personal bucket index
N: Normal (Gaussian) distribution
G: Gamma distribution
$N(.|\mu, \tau)$: Normal (Gaussian) distribution with specified mean $\mu$ and precision $\tau$
$W_{ui}$: Weight (personal parameter) for a given user and feature bucket index
$\mu_c$: Mean of community distribution for a given feature or bucket
$\tau_c$: Precision of community distribution for a given feature or bucket
$x_{umi}$: p Feature value of given user, message, and bucket Index
$s_{un}$: Latent score variable for a given user and message
$y_{un}$: Observed or predicted output of the model—true or false
v: A hyper parameter representing noise added to the score variable
||: A constrains represented by the contained identity In a system according to embodiments, learning and prediction of user behavior as a user receives data, such as an email message 210 at a user mailbox 208, may be accomplished by performing an inference on the prediction model, such as a Bayesian inference. Other incoming data, may be, for example, an instant message, a meeting invite, an audio communication, a video communication, a data sharing invite, and an application sharing invite. In an example scenario, all data from multiple users within a community may be available such that community parameters 220 for the community of users may be determined employing the prediction model. The available data may include labeled and unlabeled data, where labeled data is observed data that has been labeled with known actions executed by one or more users. Incoming data, such as an incoming email message 210 received at the user mailbox 208 may be converted to a set of feature values, where the feature values are an input into the prediction model derived from properties of the message 210. $x_{umi}$ (feature value of a given user and a bucket index) may be observed for each user, each received message or other received data, and feature buckets to produce a training set for the prediction model. $y_{un}$ may be observed only for labeled data (i.e. data that has been previously labeled with known actions). After the data has been observed and gathered, an inference may be performed on the prediction model to infer personal parameters 212 ($w_{ui}$) for any user associated with the received email message 210 and feature bucket within the community of associated users, community parameters 220 ($\mu_c$ and $\tau_c$) for any community bucket or feature, and outputs ($y_{un}$) for any unlabeled messages. In an example embodiment, the inference may return marginal posterior distributions, where $w_{ui}$ and $\mu_c$ may be inferred as Gaussian distributions, and $y_{un}$ may be inferred as Bernoulli distributions. The parameter of each Bernoulli distribution may represent the probability of a corresponding output being true. Other inference modes may also be employed to perform an inference on the prediction model and other inference modes may return distributions as point estimates or as collections of samples.

In an example embodiment, the Bayesian inference may apply the parameters (community parameters 220 and personal parameters 212) in the model along with their uncertainty employing a message passing algorithm technique. The message passing algorithm technique may enable distribution of computational load and memory requirements for the large amounts of user data across multiple nodes of the factor graph prediction model. In a message passing algorithm, messages, or other similar data, may be passed, in the form of distributions, around the predication model in an iterative schedule until convergence is reached. Posterior marginals may be retrieved from converged messages. In an example embodiment, an Expectation Propagation technique may be employed as a message passing algorithm to efficiently identify approximations to marginal posteriors.

While specific prediction models, parameters, and functions are used to describe example embodiments herein, such as Bayesian model embodiments are not limited to those and may be implemented using other models, parameters, and function.

Figure 3:
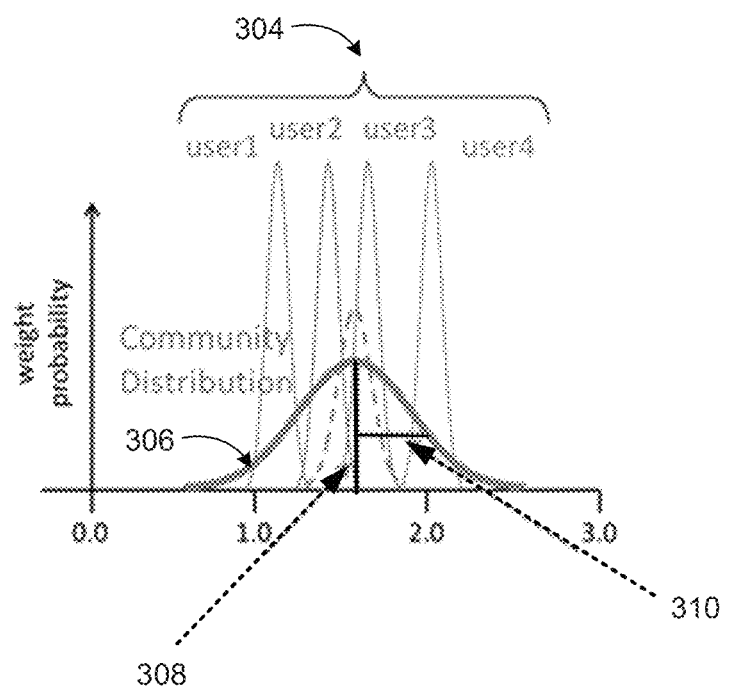
FIG. 3 illustrates interaction between community parameters and personal parameters for prediction of user behavior.

FIG. 3 illustrates interaction between community parameters and personal parameters for prediction of user behavior, according to some example embodiments.

As previously described, a prediction system may be configured to observe a group of multiple users concurrently, and may incorporate the observed actions of the multiple individual users arid a group of users into a single prediction model. The single prediction model may be a hierarchical model incorporating individual users and a group of users to enable a seamless progression between predictions for a new user and personalized predictions for a long-term user. The hierarchical model may make predictions by learning and exploiting uncertainty in personal parameters and community parameters. Diagram 300 illustrates the interaction between community parameters and personal parameters. For example, the diagram 300 shows individual user distributions 304, where each user distribution includes personal weights with uncertainty, and a community distribution 306, which may take into account all of the users within the community. Also illustrated is a community mean with uncertainty 308, and a community standard deviation 310.

Figure 4:
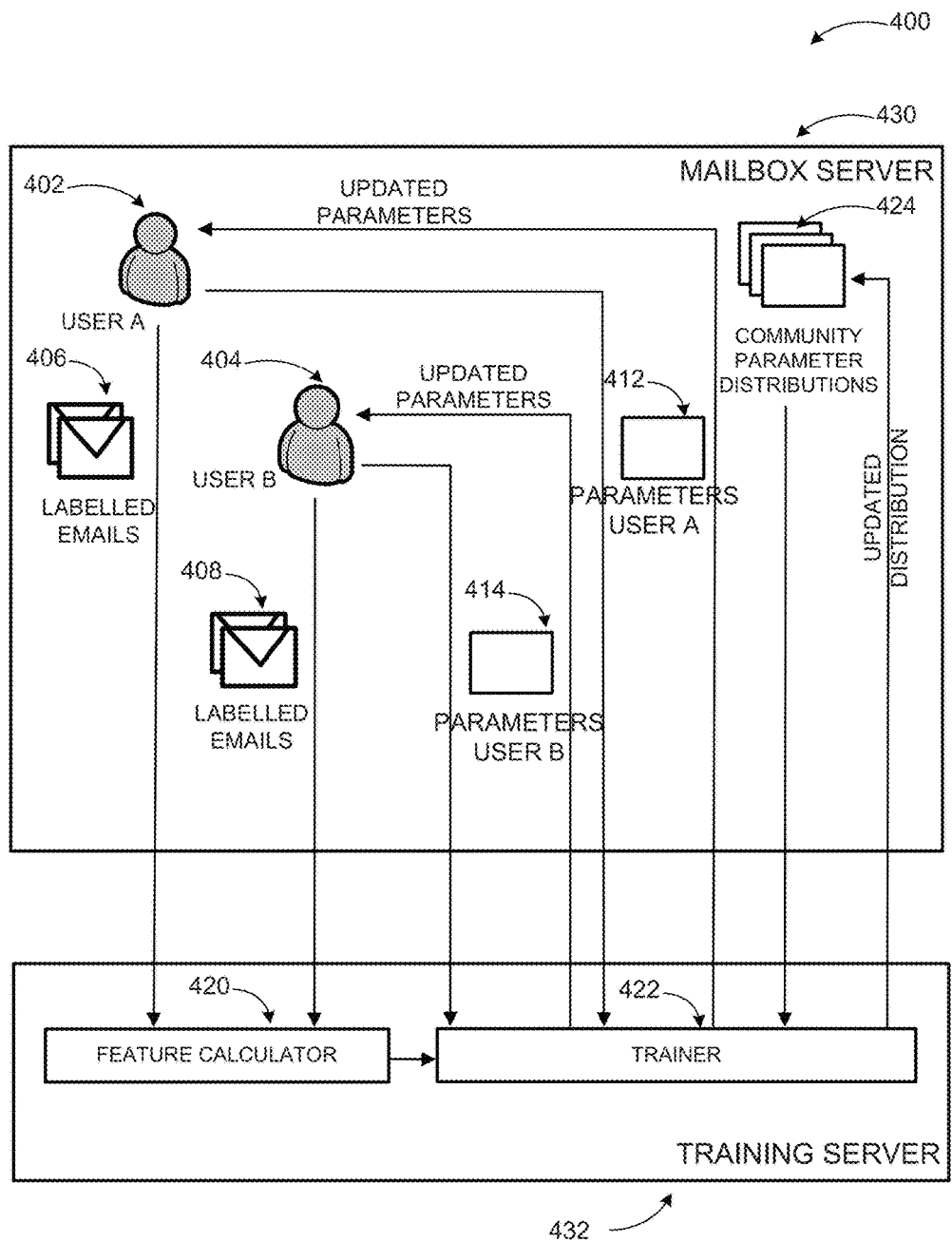
FIG. 4 illustrates an example system level view of model training for a prediction system.

FIG. 4 illustrates an example system level view of model training for a prediction system, according to example embodiments.

An example prediction system may have a learning mode and a prediction mode. In the learning mode, as illustrated in diagram 400, the prediction system may be configured to identity multiple users 402, 404 associated together within a defined community and to continuously observe the multiple users' actions upon receipt of incoming data to learn personal and community parameters for the prediction model. The community may be a group of users associated with a given mailbox server 430, or instance of an application or organization, an associated group or distributed group, and the like.

In an example embodiment, in the learning mode, a training server 432 as part of the prediction system may observe all incoming data, such as incoming ennui messages (406, 408) associated with each user within the community received during a defined period of time. The incoming data, or email messages 406, 408 may be labeled with an observed action (usually delayed) executed by the user in response to receipt of the data, such as whether a user replied to a received email. Additionally the observed executed action may be compared with an expected action, such as whether the user actually replied to a received email when a reply action is expected. When applying a label, the prediction system may wait a defined period of time before applying the label to see if the actual action really matches the predicted action, in order to give the user enough time to open an email message and execute an action.

The labeled email messages 406, 408 may be processed at a feature calculator 420 of the training server 432 where the training server 432 may apply a feature calculation to identify features and buckets associated with the Incoming data or email messages 406, 408. The prediction system may continuously track the multiple users (402, 404) over a period of time to identity a pattern of user behavior and response to received incoming data. Based on the tracked pattern of user response to incoming data, a trainer module 422 of the prediction system may be able to determine statistical distributions for personal parameters (412, 414) associated with each user 402, 404, and for community parameters 424 based on a distribution of the personal parameters 412, 414. The personal parameters 412, 414 may be weights representing the contribution of each feature bucket to the observed action, and the community parameters 424 may be means and precisions (alternatively variances or standard deviations) of Gaussian distributions which may represent variation across the entire community of a particular feature or bucket weight. The trainer module 422 may also take into account the uncertainty of both the personal and community parameters.

In an example embodiment, the learning of the personal and community parameters may be a continuous online process, and the trainer module 422 may be configured to maintain messages that summarize a current learning state and previously observed data. The trainer module 422 may be configured to continuously update the community and personal parameters as new data is received and new interactions are observed by users within the community of users. Additionally, the trainer module 422 may be maintained across operating systems, system upgrades, and system downgrades, such determined personal and community parameters may be continuously maintained for training and prediction purposes. Different feature sets, possibly sharing a subset of features, may be configured for different system versions. In an example, features may be versioned, so that if the feature calculation that defines a feature changes in a significant way, the feature version may be changed by ensuring that a change in feature calculation Involves a new identifier for the feature. Associating a feature identity with a fixed computation may also allow parallel independent models to be trained and to be run concurrently. The prediction system may be able to transition between concurrently run models.

Figure 5:
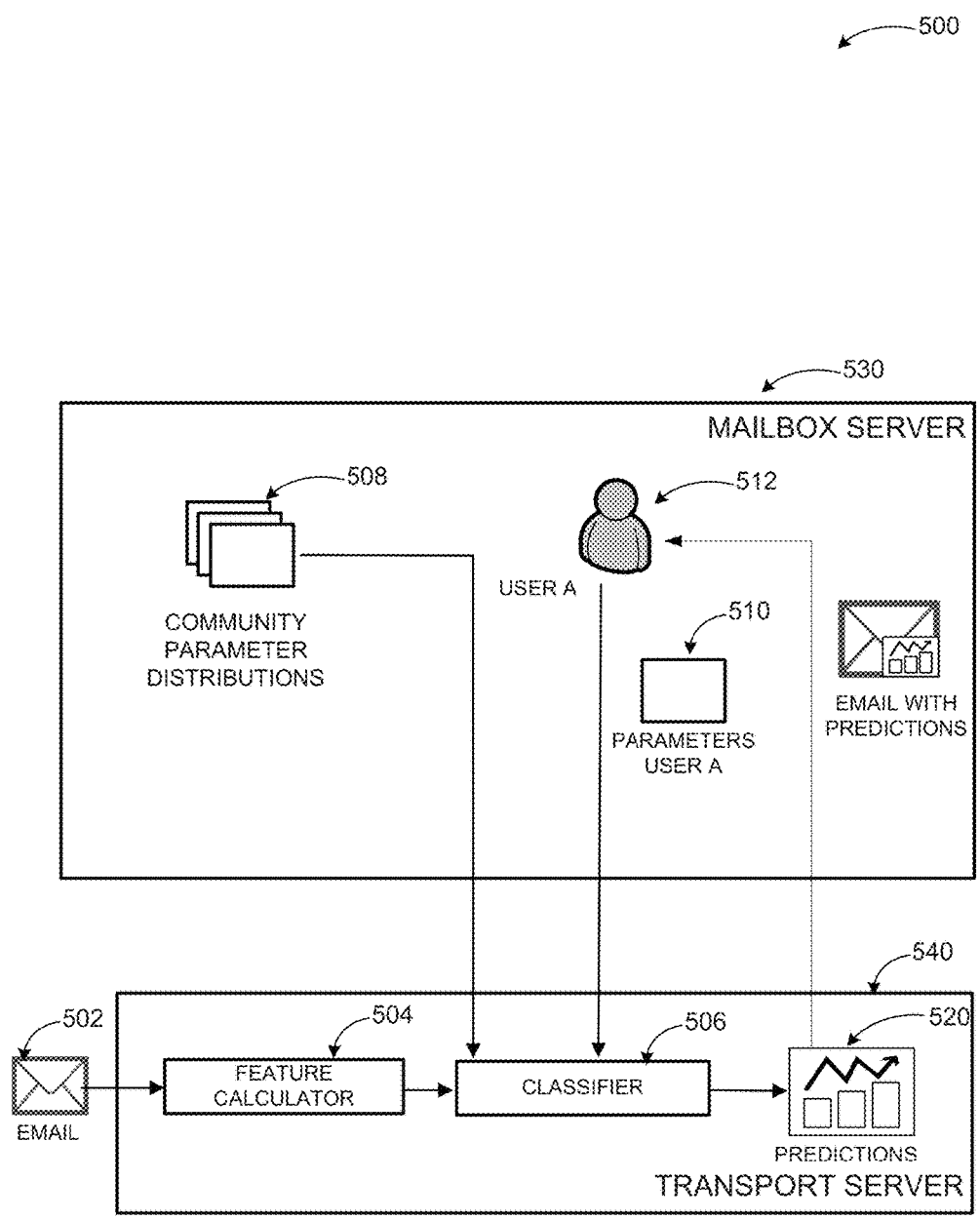
FIG. 5 illustrates an example system level view of prediction of user behavior based on a prediction model.

FIG. 5 illustrates an example system level view of prediction of user behavior based on a prediction model, according to some example embodiments.

As previously discussed, the prediction system may have a learning mode and a prediction mode. In the prediction mode, as illustrated in diagram 500, the prediction system may determine a probability of user 512 taking certain actions in response to certain incoming data at a mailbox server 530 based on a hierarchical prediction model. Based on the determined probabilities, in the prediction mode, the prediction system may predict what action a specific user may take upon receipt of particular data, and may suggest the action to the user in real time when new data is received.

In an example scenario, new data sash as an email message 502 may be received by a user. A feature calculator 504 as part of the prediction system may calculate features and buckets associated with the email message 502 and may convert the calculated features and buckets to a numerical value, A classifier module 506 may classify the email message 502 based on the determined feature calculations. The classifier module 506 may draw from community parameters 508 and personal parameters 510 associated with an individual user 512 associated with the community determined during the learning mode as described in conjunction with FIG. 4. The classifier module 506 and the feature calculator 504 may be executed at a transport server 540 configured to provide data, such as the email message 502, from to a user's mailbox over a network. The transport server 540 may provide the email message 502 with the predicted actions 520 to the user's mailbox. The prediction system may seamlessly tradeoff between the community parameters arid personal parameters to make predictions for the received email message 502, such that the prediction system may provide a personalized prediction to the user when the user's observed actions differ from observed community actions.

The example applications, devices, and modules, depicted in FIGS. 1-5 are provided for illustration purposes only. Embodiments are not limited to the configurations and content shown in the example diagrams, and may be implemented using other engines, client applications, service providers, and modules employing the principles described herein.

Figure 6:
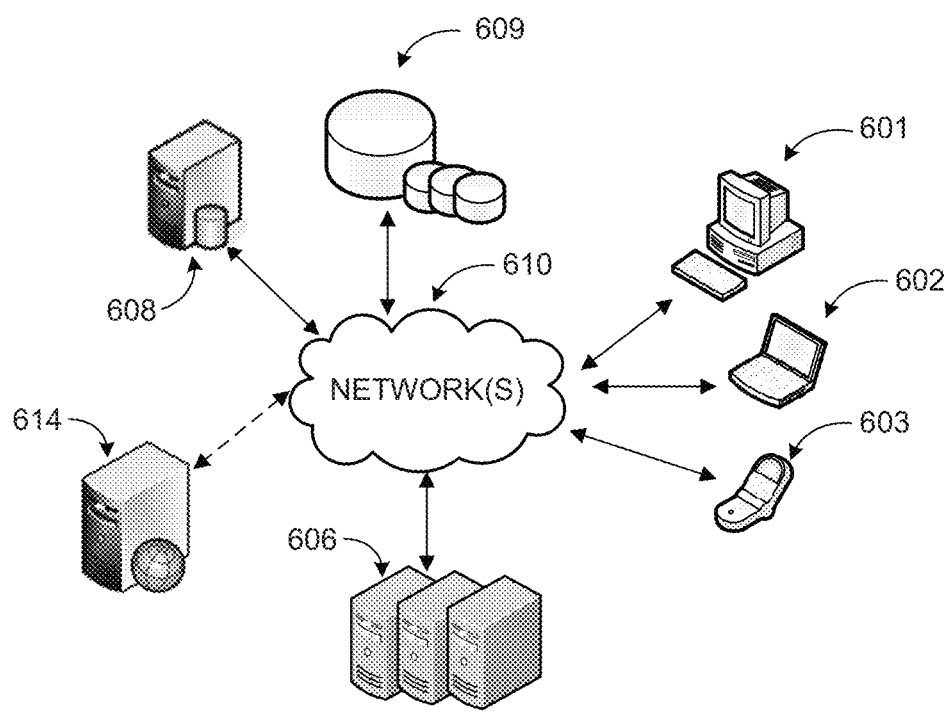
FIG. 6 is a networked environment, where a system according to embodiments may be implemented.

FIG. 6 is an example networked environment, where embodiments may be implemented. In addition to locally installed applications, a prediction application may also be employed in conjunction with hosted applications and services that may be implemented via software executed over one or mere servers 606 or individual server 614. A hosted service or application may communicate with client applications on individual computing devices such as a handheld computer, a desktop computer 601, a laptop computer 602, a smart phone 603, a tablet computer (or slate), ('client devices') through network(s) 610 and control a user interface presented to users.

Client devices 601-603 are used to access the functionality provided by the hosted service or application. One or more of the servers 606 or server 614 may be used to provide a variety of services as discussed above. Relevant data may be stored in one or more data stores (e.g. data store 609), which may be managed by any one of the servers 606 or by database server 608.

Network(s) 610 may comprise any topology of servers, clients, Internet service providers, and communication media. A system according to embodiments may have a static or dynamic topology. Network(s) 610 may include a secure network such as an enterprise network, an unsecure network such as a wireless open network, or the Internet. Network(s) 610 may also coordinate communication over other networks such as PSTN or cellular networks. Network(s) 610 provides communication between the nodes described herein. By way of example, and not limitation, network(s) 610 may include wireless media such as acoustic, RF, infrared and other wireless media.

Many other configurations of computing devices, applications, data sources, and data distribution systems may be employed to implement a hierarchical, feature based statistical model for behavior prediction and classification. Furthermore, the networked environments discussed in FIG. 6 are for illustration purposes only. Embodiments are not limited to the example applications, modules, or processes.

Figure 7:
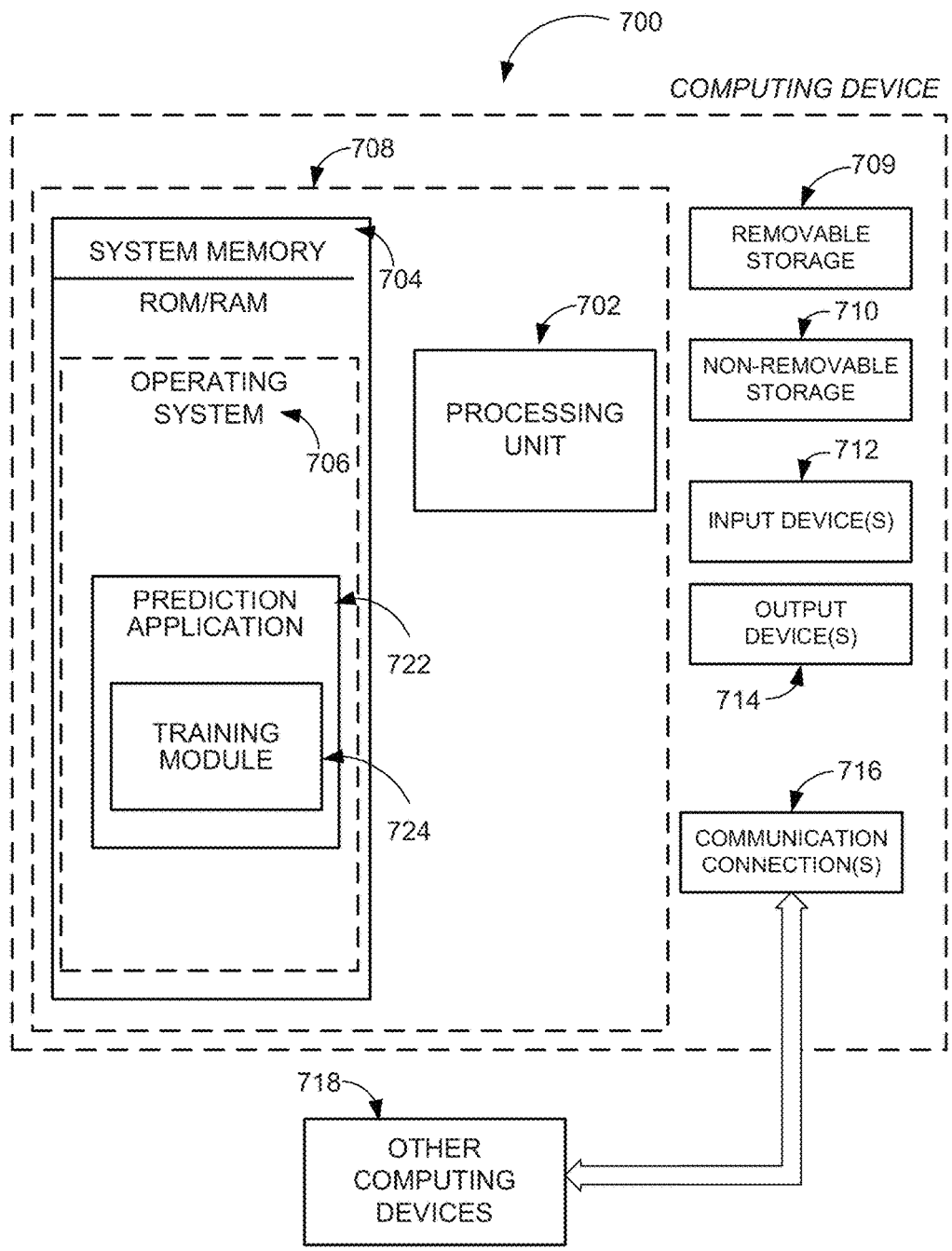
FIG. 7 is a block diagram of an example computing operating environment, where embodiments may be implemented.

FIG. 7 and the associated discussion are intended to provide a brief, general description of a suitable computing environment in which embodiments may be implemented. With reference to FIG. 7, a block diagram of an example computing operating environment for an application according to embodiments is illustrated, such as computing device 700. In a basic configuration, computing device 700 may be any of the example devices discussed herein, and may include at feast one processing unit 702 and system memory 704. Computing device 700 may also include a plurality of processing units that cooperate in executing programs.

Depending on the exact configuration and type of computing device, the system memory 704 may be volatile (such as RAM), non-volatile (such as ROM, flash memory, etc.) or some combination of the two. System memory 704 typically includes an operating system 706 suitable for controlling the operation of the platform, such as the WINDOWS®, WINDOWS MOBILE®, or WINDOWS PHONE® operating systems from MICROSOFT CORPORATION of Redmond, Wash. The system memory 704 may also include one or more software applications such as prediction application 722 and trainer module 724.

The trainer module 724 may operate in conjunction with the operating system 706 or prediction application 722 to monitor user behavior within a community of users to learn personal and community parameters. The trainer module 724, in conjunction with the prediction application 722, may generate a hierarchical feature based statistical model based on the personal and community parameters in order to predict and suggest user actions in real time. This basic configuration is illustrated in FIG. 7 by those components within dashed line 708.

Computing device 700 may have additional features or functionality. For example, the computing device 700 may also include additional data storage devices (removable and/or non-removable) such as, for example, magnetic disks, optical disks, or tape. Such additional storage is illustrated in FIG. 7 by removable storage 709 and non-removable storage 710. Computer readable storage media may include volatile and nonvolatile, removable and non-removable media implemented in any method or technology for storage of information, such as computer readable instructions, data structures, program modules, or other data. System memory 704, removable storage 700 and non-removable storage 710 are all examples of computer readable storage media. Computer readable storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer readable storage media may be part of computing device 700. Computing device 700 may also have input device(s) 712 such as keyboard, mouse, pen, voice input device, touch input device, an optical capture device for detecting gestures, and comparable input devices. Output device(s) 714 such as a display, speakers, printer, and other types of output devices may also be included. These devices are well known in the art and need not be discussed at length here.

Computing device 700 may also contain communication connections 716 that allow the device to communicate with other devices 718, such as over a wireless network in a distributed computing environment, a satellite link, a cellular link, and comparable mechanisms. Other devices 718 may include computer device(s) that execute communication applications, other directory or policy servers, and comparable devices. Communication connection(s) 716 is one example of communication media. Communication media can include therein computer readable instructions, data structures, program, modules, or other data in a modulated data signal, such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media, such as acoustic, RF, infrared and other wireless media.

Example embodiments also include methods. These methods can be implemented in any number of ways, including the structures described in this document. One such way is by machine operations, of devices of the type described in this document.

Another optional way is for one or more of the individual operations of the methods to be performed in conjunction with one or more human operators performing some. These human operators need not be collocated with each other, but each can be only with a machine that performs a portion of the program.

Figure 8:
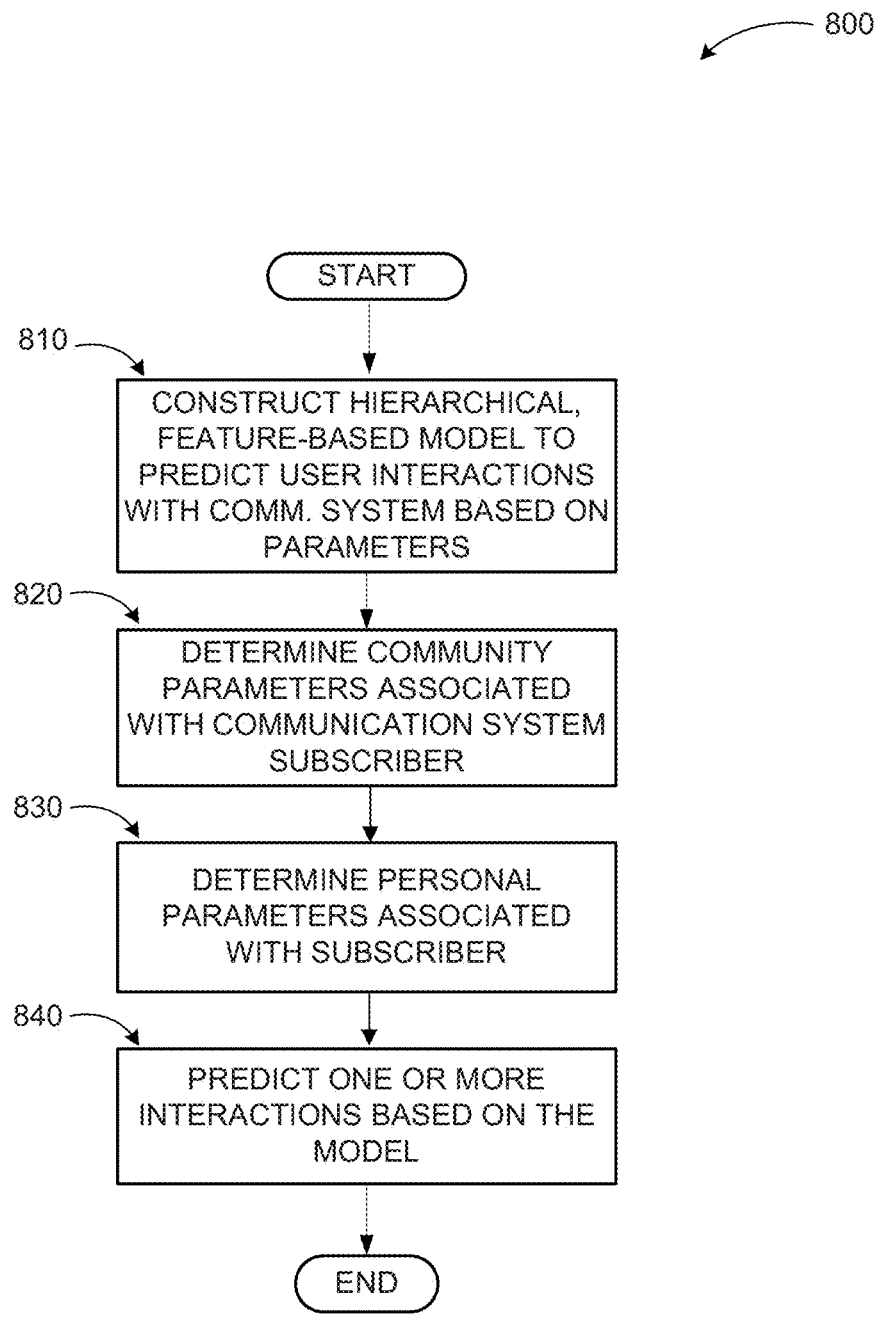
FIG. 8 illustrates a logic flow diagram for a process of providing a hierarchical feature based statistical model for behavior predication and classification, according to embodiments.

FIG. 8 illustrates a logic flow diagram for a process of providing a hierarchical feature based statistical model for behavior predication and classification, according to embodiments. Process 800 may be implemented as part of an application or an operating system.

The hierarchical model according to embodiments may allow a seamless progression between predictions for a completely new user and the highly personalized predictions of a long-term user by learning and exploiting uncertainty in personal parameters. In some embodiments, approximate Bayesian inference may be used to learn the personal and community parameters in the hierarchical model. The approximate Bayesian inference (or other learning algorithms) may also be used to learn the uncertainty of community parameters. The personal and community parameters may be updated continuously online. Moreover, the hierarchical model may be trained and applied when the community parameters are trained offline using a sample set of users, and then corrected online. In yet other examples, the model may be trained and applied when the community parameters are trained online using a sample set of users, and then corrected online for the population. In further embodiments, the prediction model may be employed to make personalized predictions in a communications system, for email intelligence, for prediction actions of email recipients, and/or for email triage. In yet other embodiments, personal and/or community parameters may be preserved across upgrades and downgrades of the system. In yet other embodiments, more than one hierarchical model may be operating at once, and the system may be enabled to transition between available models.

Providing a high level overview to a system according to some embodiments, process 800 may begin with operation 810, where a prediction model may be constructed to predict subscriber interactions based on community and personal parameters. The prediction model may be a hierarchical, feature based model that represents a joint probability density function in terms of its factors, where the factors are inputs including the community and personal parameters. Inference, such as Bayesian inference, may be employed to determine a probability of user interactions based on the prediction model.

Operation 810 may be followed by operation 820, where a prediction system employing the above-discussed prediction model may observe a community, or group, of users associated with a communication system, and may learn habits and behaviors of interactions with the communication system of each user within the community. Example interactions may be actions executed in response to receipt of incoming data associated with the communication system. Community parameters may include a cumulative learned behavior of all of the subscribers associated with the communication system.

Operation 820 may be followed by operation 830, where the prediction system may observe each user, or subscriber, individually as the individual interacts with the communication system, and may learn the habits and behaviors of the individual user. The learned habits and behaviors of the individual user may be stored as personal parameters.

Operation 830 may be followed by operation 840, where, as incoming data is received by a user in real time at the communication system, one or more interactions may be predicted and suggested to the user employing the model. The predicted interaction may be a highly personalized suggestion based on personal parameters observed for the individual subscriber, and the predicted interaction may also be based on community parameters where historical information and personal parameters for the user may not be available.

The operations included in process 800 are for illustration purposes. Providing a hierarchical feature based statistical model for behavior predication and classification according to embodiments may be implemented by similar processes with fewer or additional steps, as well as in different order of operations using the principles described herein.

The above specification, examples and data provide a complete description of the manufacture and use of the composition of the embodiments. Although the subject matter has been described in language specific to structural features and/or methodological acts, it is to be understood that the subject matter defined in the appended claims is not necessarily limited to the specific features or acts described above. Rather, the specific features and acts described above am disclosed as example forms of implementing the claims and embodiments.

What is claimed is:

1. A method executed at least its part in a computing device to provide a hierarchical, feature based statistical model for behavior predication and classification, the method comprising:
   constructing a hierarchical, feature based model for predicting subscriber interactions with the communication system based on community and personal parameters;
   determining one or more community parameters associated with a subscriber of a communication system;
   determining one or more personal parameters associated with the subscriber; and
   generating one or more personalized predictions for one or more interactions with the communication system using the model.

2. The method of claim 1, further comprising:
   employing the predicted interactions in one or more of communication intelligence and communication triage; and
   updating the community parameters and the personal parameters online.

3. The method of claim 1, wherein the communication system facilitates one or more of: an email exchange, an instant message exchange, an audio communication, a video communication, an online meeting, data sharing, and application sharing.

4. The method of claim 1, further comprising:
   upon receiving an incoming communication, in a learning mode, observing a subscriber interaction with the incoming communication, and labeling the incoming communication with the observed interaction.

5. The method of claim 4, further comprising:
   upon receiving the incoming communication, converting the incoming communication to a set of feature values.

6. The method of claim 5, further comprising:
   determining one or more bucket identities associated with each set of feature values, wherein the feature values are input values to the model derived from properties of the incoming communication.

7. The method of claim 1, further comprising:
   employing more than a plurality of models in the communication system; and
   enabling transitioning between the models.

8. The method of claim 7, wherein the bucket identities represent a set of discrete choices associated with the incoming communication.

9. The method of claim 1, further comprising:
   training and applying the model when the community parameters are trained offline using a sample set of subscribers and then correcting the model online; and
   training and applying the model when the community parameters are trained online using another sample set of subscribers and then correcting the model online for an entire set of subscribers.

10. The method of claim 9, further comprising:
    employing an approximate Bayesian inference to learn one or more of the community parameters and the personal parameters and an uncertainty of the community parameters and the personal parameters in the model.

11. A computing device to provide a hierarchical, feature based statistical model for behavior predication and classification, the computing device comprising:
    a memory;
    a processor coupled to the memory, the processor executing a prediction application, wherein the processor is configured to:
      construct a hierarchical, feature based model for predicting subscriber interactions with the communication system based on community and personal parameters;
      determine one or more community parameters associated with a subscriber of the communication system at a trainer module;
      determine one of more personal parameters associated with the subscriber at the trainer module;
      generate one or snore personalized predictions for one or more interactions with the communication system using the model; and
      process an incoming communication based on predicted interactions.

12. The computing device of claim 11, wherein the prediction application is configured to operate in a learning mode and a prediction mode.

13. The computing device of claim 11, wherein the communication system facilitates one or more of: an email exchange, an instant message exchange, an audio communication, a video communication, an online meeting, data sharing, and application sharing, and wherein the incoming communication is one or more of an email, an instant message, a meeting invite, an audio communication, a video communication, a data sharing invite, and an application sharing invite.

14. The computing device of claim 11, wherein the community parameters and the personal parameters are preserved across one of an upgrade and a downgrade of the communication system.

15. The computing device of claim 11, wherein, in a learning mode, the processor is configured to:
    observe incoming communications associated with each subscriber in a community of subscribers during a predefined period of time; and label the incoming communications with an observed action executed by each of the subscribers in response to receipt of the incoming communications.

16. The computing device of claim 15, wherein, in the learning mode, the processor is configured to:
process the incoming communications at a feature calculator module of the prediction application to apply a feature calculation to identify features and buckets associated with the incoming communications.

17. The computing device of claim 11, wherein the hierarchical, feature based model is a regression model.

18. A computer-readable memory device with instructions stored thereon to provide a hierarchical, feature based statistical model for behavior prediction and classification, the instructions comprising:
constructing a hierarchical, feature based model for predicting user interactions with a system based on community and personal parameters;
determining one or more community parameters associated with a user of the system;
determining one or more personal parameters associated with the user;
generating one or more personalized predictions for one or more interactions with the system using the model;
processing an incoming communication based on predicted interactions; and
suggesting an action to the user based on the predicted interactions.

19. The computer-readable memory device of claim 18, wherein the instructions further comprise:
observing incoming communications associated with each subscriber in a community of subscribers during a defined period of time at a trainer module;
labeling the incoming communications with an observed action executed by each of the subscribers in response to receipt of the incoming communications; and
comparing the observed action to an expected action.

20. The computer-readable memory device of claim 18, wherein the system includes one or more of a communication system, an advertising system, a content generation/distribution system in a content marketplace, a content generation/distribution system in a product marketplace, a search, system, a navigation system, and a services system.

* * * * *